United States Patent
Wang et al.

(10) Patent No.: US 12,267,083 B2
(45) Date of Patent: Apr. 1, 2025

(54) SAMPLING ASSEMBLY AND SAMPLING METHOD

(71) Applicant: Huawei Technologies Co., Ltd., Shenzhen (CN)

(72) Inventors: Haifei Wang, Chengdu (CN); Yan Zhuang, Nanjing (CN); Wan Zhou, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 109 days.

(21) Appl. No.: 18/343,120

(22) Filed: Jun. 28, 2023

(65) Prior Publication Data

US 2023/0344437 A1    Oct. 26, 2023

Related U.S. Application Data

(63) Continuation of application No. PCT/CN2020/140575, filed on Dec. 29, 2020.

(51) Int. Cl.
*H03M 1/10* (2006.01)
*G01R 15/04* (2006.01)
(Continued)

(52) U.S. Cl.
CPC ........... *H03M 1/1014* (2013.01); *G01R 15/04* (2013.01); *G01R 19/0084* (2013.01); *H03M 1/0639* (2013.01); *H03M 1/1033* (2013.01)

(58) Field of Classification Search
CPC ............. H03M 1/1014; H03M 1/1033; H03M 1/0639; G01R 15/04; G01R 19/0084
See application file for complete search history.

(56) References Cited

U.S. PATENT DOCUMENTS

2019/0305791 A1*  10/2019  Ali  ..................... H03M 1/0639

FOREIGN PATENT DOCUMENTS

JP    2007267126 A    10/2007
JP    2010259035 A    11/2010

OTHER PUBLICATIONS 802.3af, IEEE Standard for Information technologyTelecommunications and information exchange between systems Local and metropolitan area networks Specific requirements Part 3: Carrier Sense Multiple Access with Collision Detection (CSMA/CD) Access Method and Physical Layer Specifications Amendment: Data Terminal Equipment (DTE) Power via Media Dependent Interface (MDI), IEEE Computer Society, Jun. 18, 2003, total 133 pages.

(Continued)

*Primary Examiner* — Joseph J Lauture
(74) *Attorney, Agent, or Firm* — SLATER MATSIL, LLP

(57) ABSTRACT

A sampling assembly and a sampling method are provided. A self-calibration unit controls a first switch to be turned on, to enable a first sampling signal to be input to a sampling unit. The sampling unit processes the first sampling signal to obtain a second sampling signal, and outputs the second sampling signal to the self-calibration unit. The self-calibration unit controls the first switch to be turned off, controls a second switch to be turned on, and outputs a first calibration signal to the sampling unit. The sampling unit processes the first calibration signal to obtain a second calibration signal, and outputs the second calibration signal to the self-calibration unit. The self-calibration unit determines an error signal based on the first calibration signal and the second calibration signal. The self-calibration unit obtains a calibrated third sampling signal based on the second sampling signal and the error signal.

20 Claims, 5 Drawing Sheets

(51) Int. Cl.
    *G01R 19/00*    (2006.01)
    *H03M 1/06*    (2006.01)

(56) References Cited

OTHER PUBLICATIONS 802.3at, IEEE Standard for Information technology—Local and metropolitan area networks—Specific requirements—Part 3: CSMA/CD Access Method and Physical Layer Specifications Amendment 3: Data Terminal Equipment (DTE) Power via the Media Dependent Interface (MDI) Enhancements, IEEE Computer Society, Oct. 30, 2009, total 141 pages.

802.3bt, IEEE Standard for Ethernet Amendment 2: Physical Layer and Management Parameters for Power over Ethernet over 4 pairs, IEEE Computer Society, Sep. 27, 2018, total 291 pages.

* cited by examiner

SAMPLING ASSEMBLY AND SAMPLING METHOD

CROSS-REFERENCE TO RELATED APPLICATIONS

This application is a continuation of International Application No. PCT/CN2020/140575, filed on Dec. 29, 2020, the disclosure of which is hereby incorporated by reference in its entirety.

TECHNICAL FIELD

This application relates to the communications field, and more specifically, to a sampling assembly and a sampling method.

BACKGROUND

Generally, there is a deviation between an input signal and output signal of a sampling circuit. The deviation may fluctuate with an individual difference, a temperature, an operating voltage, and the like of the sampling circuit. The deviation severely affects sampling precision of the sampling circuit, and affects stable and correct operation of a system.

SUMMARY

This application provides a sampling assembly and a sampling method, to compensate for a deviation between an input signal and output signal of a sampling circuit, to improve sampling precision.

According to a first aspect, this application provides a sampling assembly. The sampling assembly includes a self-calibration unit, a sampling unit, a first switch, and a second switch.

The self-calibration unit is configured to control the first switch to be turned on, to enable a first sampling signal to be input to the sampling unit. The sampling unit is configured to process the first sampling signal to obtain a second sampling signal, and output the second sampling signal to the self-calibration unit.

The self-calibration unit is further configured to control the first switch to be turned off, control the second switch to be turned on, and output a first calibration signal to the sampling unit. The sampling unit is further configured to process the first calibration signal to obtain a second calibration signal, and output the second calibration signal to the self-calibration unit. The self-calibration unit is further configured to determine an error signal based on the first calibration signal and the second calibration signal.

The self-calibration unit is further configured to obtain a calibrated third sampling signal based on the second sampling signal and the error signal.

In this way, according to the sampling assembly in this application, the error signal may be obtained by mutual cooperation of the self-calibration unit, the first switch, and the second switch, so that a deviation between an input signal and output signal of the sampling assembly can be compensated for, thereby improving sampling precision.

In some possible implementations, the sampling unit includes an amplification unit and/or an analog-to-digital conversion unit.

For example, when the first sampling signal is strong enough, analog-to-digital conversion may be directly performed without processing such as signal amplification. In other words, in technical solutions of this application, an error caused by the digital-to-analog conversion unit may be compensated for, thereby helping improve signal sampling precision.

For another example, when the first sampling signal is not strong enough, signal amplification processing may be performed on the first sampling signal. In other words, in the technical solutions of this application, an error caused by the amplification unit may be compensated for. Generally, a signal amplification part is a major part in which an error is caused. Therefore, in the technical solutions of this application, signal sampling precision may be effectively improved.

For another example, the sampling unit includes the amplification unit and the analog-to-digital conversion unit. In this way, in the technical solutions of this application, the error caused by the amplification unit and the error caused by the analog-to-digital conversion unit may be compensated for, thereby effectively improving signal sampling precision.

In some possible implementations, when the sampling unit includes the amplification unit and the analog-to-digital conversion unit, the sampling unit further includes a third switch. The self-calibration unit is further configured to: when controlling the second switch to be turned on, control the third switch to be turned on, to enable a third calibration signal output by the amplification unit to be input to the self-calibration unit. The self-calibration unit is specifically configured to determine the error signal based on the first calibration signal, the second calibration signal, and the third calibration signal.

In some possible implementations, the self-calibration unit includes a calibration unit and a control unit. The calibration unit is configured to obtain the error signal, and the control unit is configured to receive the second sampling signal, and obtain the third sampling signal based on the error signal and the second sampling signal. Alternatively, the calibration unit is configured to obtain the third sampling signal, and output the third sampling signal to the control unit.

The control unit may include at least one of the following: a state machine (state machine), a digital signal processor (digital signal processor, DSP), an advanced reduced instruction set computing machine (advanced reduced instruction set computing machine, ARM), a linear power controller (linear power controller, LPC), an MC51 single-chip microcomputer, and the like.

According to a second aspect, this application provides a sampling method. The method is applied to a sampling assembly including a self-calibration unit, a sampling unit, a first switch, and a second switch. The method includes:

The self-calibration unit controls the first switch to be turned on, to enable a first sampling signal to be input to the sampling unit. The sampling unit processes the first sampling signal to obtain a second sampling signal, and outputs the second sampling signal to the self-calibration unit.

The self-calibration unit controls the first switch to be turned off, controls the second switch to be turned on, and outputs a first calibration signal to the sampling unit. The sampling unit processes the first calibration signal to obtain a second calibration signal, and outputs the second calibration signal to the self-calibration unit. The self-calibration unit determines an error signal based on the first calibration signal and the second calibration signal.

The self-calibration unit obtains a calibrated third sampling signal based on the second sampling signal and the error signal.

In this way, according to the sampling method in this application, the error signal may be obtained by mutual cooperation of the self-calibration unit, the first switch, and the second switch, so that a deviation between an input signal and output signal of the sampling assembly can be compensated for, thereby improving sampling precision.

In some possible implementations, the sampling unit includes an amplification unit and/or an analog-to-digital conversion unit.

For example, when the first sampling signal is strong enough, analog-to-digital conversion may be directly performed without processing such as signal amplification. In other words, in technical solutions of this application, an error caused by the digital-to-analog conversion unit may be compensated for, thereby helping improve signal sampling precision.

For another example, when the first sampling signal is not strong enough, signal amplification processing may be performed on the first sampling signal. In other words, in the technical solutions of this application, an error caused by the amplification unit may be compensated for. Generally, a signal amplification part is a major part in which an error is caused. Therefore, in the technical solutions of this application, signal sampling precision may be effectively improved.

For another example, the sampling unit includes the amplification unit and the analog-to-digital conversion unit. In this way, in the technical solutions of this application, the error caused by the amplification unit and the error caused by the analog-to-digital conversion unit may be compensated for, thereby effectively improving signal sampling precision.

In some possible implementations, when the sampling unit includes the amplification unit and the analog-to-digital conversion unit, the sampling unit further includes a third switch. The method further includes: When controlling the second switch to be turned on, the self-calibration unit controls the third switch to be turned on, to enable a third calibration signal output by the amplification unit to be input to the self-calibration unit. That the determining an error signal based on the first calibration signal and the second calibration signal includes: determining the error signal based on the first calibration signal, the second calibration signal, and the third calibration signal.

In some possible implementations, the self-calibration unit includes a calibration unit and a control unit. That the self-calibration unit obtains a calibrated third sampling signal based on the second sampling signal and the error signal includes: The calibration unit obtains the error signal. The control unit receives the second sampling signal, and obtains the third sampling signal based on the error signal and the second sampling signal. Alternatively, the calibration unit obtains the third sampling signal, and outputs the third sampling signal to the control unit.

According to a third aspect, this application provides a chip. The chip includes a processor and the sampling assembly according to the first aspect or any one of possible implementations of the first aspect.

According to a fourth aspect, this application provides an integrated circuit. The integrated circuit includes the sampling assembly according to the first aspect or any one of possible implementations of the first aspect.

According to a fifth aspect, this application provides power sourcing equipment (power sourcing equipment, PSE), including the sampling assembly according to the first aspect or any one of possible implementations of the first aspect.

According to a sixth aspect, this application provides an electronic device. The electronic device includes a processor, a memory, and the sampling assembly according to the first aspect or any one of possible implementations of the first aspect.

According to a seventh aspect, this application provides a power over Ethernet (power over Ethernet, POE) system. The system includes the sampling assembly according to the first aspect or any one of possible implementations of the first aspect.

According to an eighth aspect, this application provides a computer-readable storage medium, including instructions. When the instructions are executed by a computer, the method in the second aspect or any one of possible implementations of the second aspect is implemented.

DETAILED DESCRIPTION OF ILLUSTRATIVE EMBODIMENTS

The following describes technical solutions in this application with reference to the accompanying drawings.

The technical solutions in embodiments of this application may be applied to various sampling scenarios, for example, a POE scenario, a power amplifier current detection scenario, a module power consumption detection scenario, a voltage detection scenario, a current detection scenario, a power detection scenario, a pressure detection scenario, a blood pressure detection scenario, a field strength detection scenario, and a gravity detection scenario.

The following describes the technical solutions of this application by using the POE scenario as an example.

Without any change to an existing Ethernet cable infrastructure, in addition to transmitting data signals for some internet protocol (internet protocol, IP)-based terminals (for example, an IP phone, a wireless local area network access point (access point, AP), and a network camera), POE can further provide a direct current power supply technology for such devices. The POE can ensure normal operation of an existing network while ensuring safety of existing structured cabling, so that costs are minimized.

A complete POE system includes two parts: PSE and a powered device (powered device, PD). The PSE is a device that supplies power to an Ethernet client device and is also a manager of the entire POE power supply process. The PD is a PSE load that receives power supply, that is, a client device of the POE system, for example, an Ethernet device such as the IP phone, a network security camera, the AP, a palmtop computer, or a mobile phone charger (where actually, any device whose power is not greater than 13 W may obtain corresponding power from a twisted pair socket). According to standards of institute of electrical and electronics engineers (institute of electrical and electronics engineers, IEEE) 802.3af, 802.3AT, and 802.3BT, the PSE and the PD establish information connections related to a connection status, a device type, a power consumption level, and the like of the PD, and the PSE supplies power to the PD through the Ethernet based on the information connections.

Figure 1:
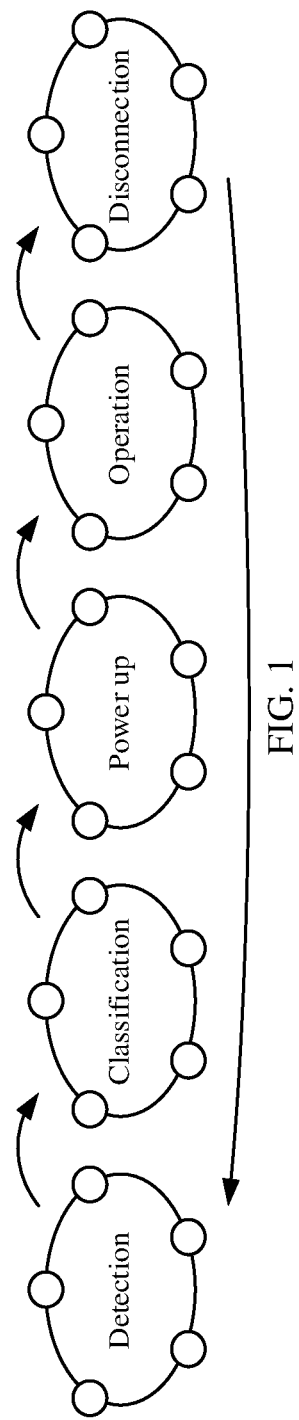
FIG. 1 is a schematic diagram of a working procedure of a POE system.

FIG. 1 is a schematic diagram of a working procedure of a POE system.

As shown in FIG. 1, the working procedure of the POE system includes detection (detection), classification (classification), power up (power up), operation (operation), disconnection (disconnection), and the like.

Detection

In the phase, PSE detects whether a PD exists. Only when the PD is detected, the PSE performs a next operation.

In an implementation, the PSE measures a resistance-capacitance value between output power wire pairs to determine whether the PD exists.

For example, in the detection phase, an output voltage of the PSE ranges from 2.8 V to 10 V, and voltage polarity is the same as voltage polarity of a −48 V output voltage. The PSE measures the resistance-capacitance value between the output power wire pairs to determine whether the PD exists. Features of the PD are as follows. Direct current impedance ranges from 19 K ohm to 26.5 K ohm. Capacitance is less than or equal to 150 nF.

Classification

The phase is an optional process.

In the phase, the PSE determines power consumption of the PD.

In an implementation, the PSE determines a PD power level by measuring an output power current.

For example, in the classification phase, an output voltage of the PSE ranges from 15.5 V to 20.5 V, and voltage polarity is the same as a voltage polarity of a −48 V output voltage.

Power Up

In the phase, the PSE powers up the PD.

For example, when the PSE detects that a device connected to a PSE port is a valid PD and the PSE completes the classification (optional) of the PD, the PSE starts to power up the PD and outputs a −48 V voltage.

Operation

In the phase, the PSE performs real time protection (RTP) and power management (PM).

Disconnection

In the phase, the PSE detects whether the PD is disconnected. The phase is a key part of local detection.

It can be learned from the foregoing that accurate signal detection by the PSE is critical to the operation of the POE system.

Generally, there is a deviation between an input signal and output signal of a sampling circuit in the POE system. The deviation may fluctuate with an individual difference, a temperature, an operating voltage, a batch, and the like of the sampling circuit. The deviation severely affects sampling precision of the sampling circuit, and affects stable and correct operation of the POE system.

This application provides a sampling assembly and a sampling method, to compensate for a deviation between an input signal and output signal of a sampling circuit, to improve sampling precision.

Figure 2:
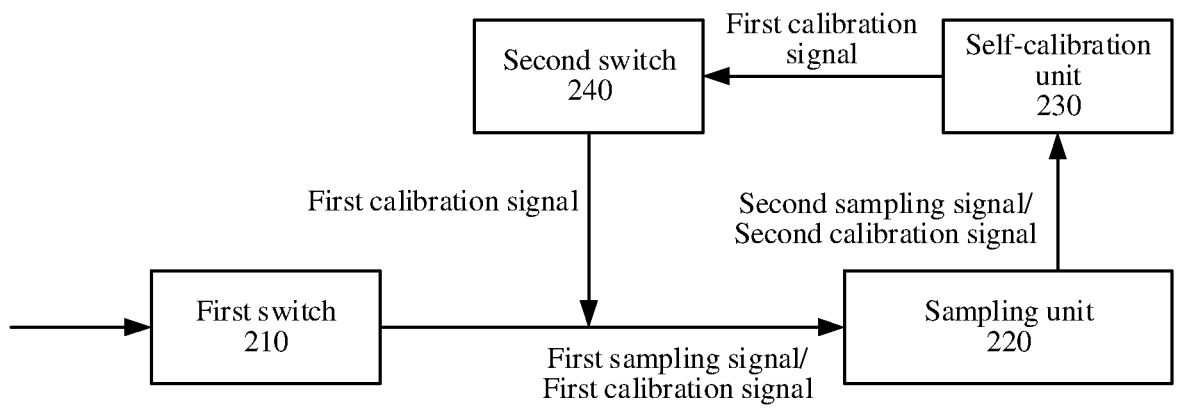
FIG. 2 is a schematic diagram of a structure of a sampling assembly according to this application.

FIG. 2 is a schematic diagram of a structure of a sampling assembly according to this application.

The sampling assembly in this application may be used in a POE system or another system or scenario in which sampling needs to be performed.

The sampling assembly shown in FIG. 2 may include a first switch 210, a sampling unit 220, a self-calibration unit 230, and a second switch 240. As shown in FIG. 2, the first switch 210 is connected to the sampling unit 220. The sampling unit 220 is separately connected to the first switch 210, the second switch 240, and the self-calibration unit 230. The self-calibration unit 230 is connected to the sampling unit 220 and the second switch 240. The self-calibration unit 230 is configured to control the first switch 210 and the second switch 240 to be turned on or turned off, and compensate for a sampling signal. The sampling unit 220 is configured to process a received signal, for example, perform amplification or analog-to-digital conversion on the received signal.

The following describes specific functions of units of the sampling assembly.

The self-calibration unit 230 is configured to control the first switch to be turned on, to enable a first sampling signal to be input to the sampling unit 220. The sampling unit 220 is configured to process the first sampling signal to obtain a second sampling signal, and output the second sampling signal to the self-calibration unit 230.

The self-calibration unit 230 is further configured to control the first switch 210 to be turned off, control the second switch 240 to be turned on, and output a first calibration signal to the sampling unit 220. The sampling unit 220 is further configured to process the first calibration signal to obtain a second calibration signal, and output the second calibration signal to the self-calibration unit 230. The self-calibration unit 230 is further configured to determine an error signal based on the first calibration signal and the second calibration signal.

The self-calibration unit 230 is further configured to obtain a calibrated third sampling signal based on the second sampling signal and the error signal.

In this way, according to the sampling assembly in this embodiment of this application, the error signal may be obtained by mutual cooperation of the self-calibration unit 230, the first switch 210, and the second switch 240, so that a deviation between an input signal and output signal of the sampling assembly can be compensated for, thereby improving sampling precision.

In some implementations, the self-calibration unit 230 may periodically control the first switch 210 to be turned on or turned off, to implement periodic sampling. A periodicity for turn-on or turn-off of the first switch 210 is not specifically limited in this application, in other words, a sampling periodicity is not specifically limited. In this application, the error signal may be determined in each sampling periodicity, and the second sampling signal is compensated for based on the error signal determined in real time. Alternatively, the error signal may be determined once every N sampling periodicities, where N is an integer greater than 1. The second sampling signal is compensated for by using a same error signal in the N sampling periodicities.

It should be noted that, in this application, determining the error signal first or obtaining the second sampling signal first is not specifically limited.

Processing that can be performed by the sampling unit 220 is not specifically limited in this embodiment of this application.

Figure 3:
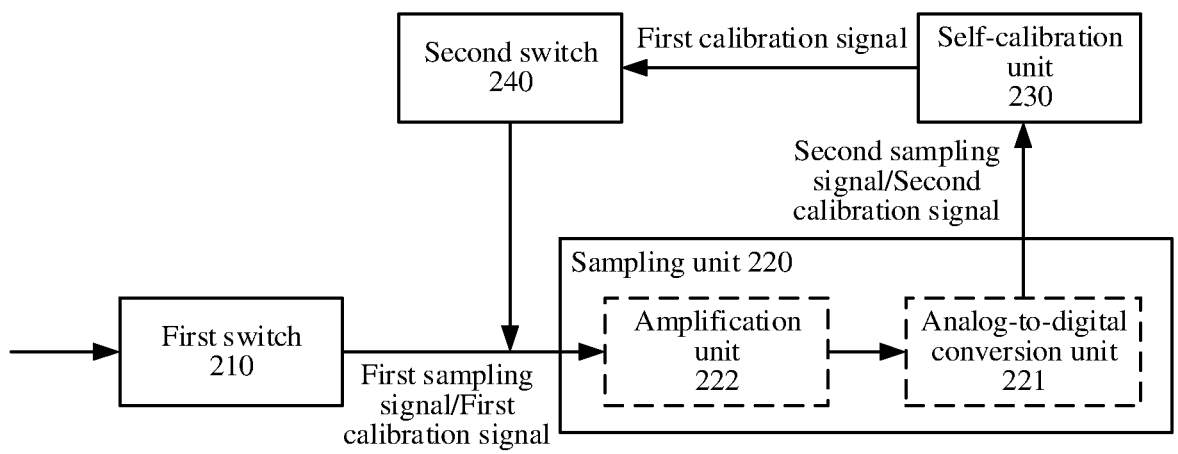
FIG. 3 is another schematic diagram of a structure of a sampling assembly according to this application.

FIG. 3 is another schematic diagram of a structure of a sampling assembly according to this application.

In some implementations, as shown in FIG. 3, a sampling unit 220 includes a digital-to-analog conversion unit 221. The digital-to-analog conversion unit 221 is configured to perform digital-to-analog conversion on a first sampling signal. The digital-to-analog conversion unit 221 may include at least one digital-to-analog converter. In other words, in technical solutions of this application, an error caused by the digital-to-analog conversion unit 221 may be compensated for, thereby helping improve signal sampling precision.

For example, when the first sampling signal is strong enough, analog-to-digital conversion may be directly performed without processing such as signal amplification.

In some other implementations, as shown in FIG. 3, the sampling unit 220 includes an amplification unit 222. The amplification unit 222 is configured to perform amplification on the first sampling signal. The digital-to-analog conversion unit 222 may include at least one operational amplifier. In other words, in the technical solutions of this application, an error caused by the amplification unit 222 may be compensated for. Generally, a signal amplification part is a major part in which an error is caused. Therefore, in the technical solutions of this application, signal sampling precision may be effectively improved.

For example, when the first sampling signal is not strong enough, signal amplification processing may be performed on the first sampling signal.

In still some implementations, as shown in FIG. 3, the sampling unit 220 includes the amplification unit 222 and the digital-to-analog conversion unit 221. For descriptions of the amplification unit 222 and the digital-to-analog conversion unit 221, refer to the foregoing descriptions. In other words, in the technical solutions of this application, the error caused by the amplification unit 222 and the error caused by the analog-to-digital conversion unit 221 may be compensated for, thereby effectively improve the signal sampling precision.

Figure 4:
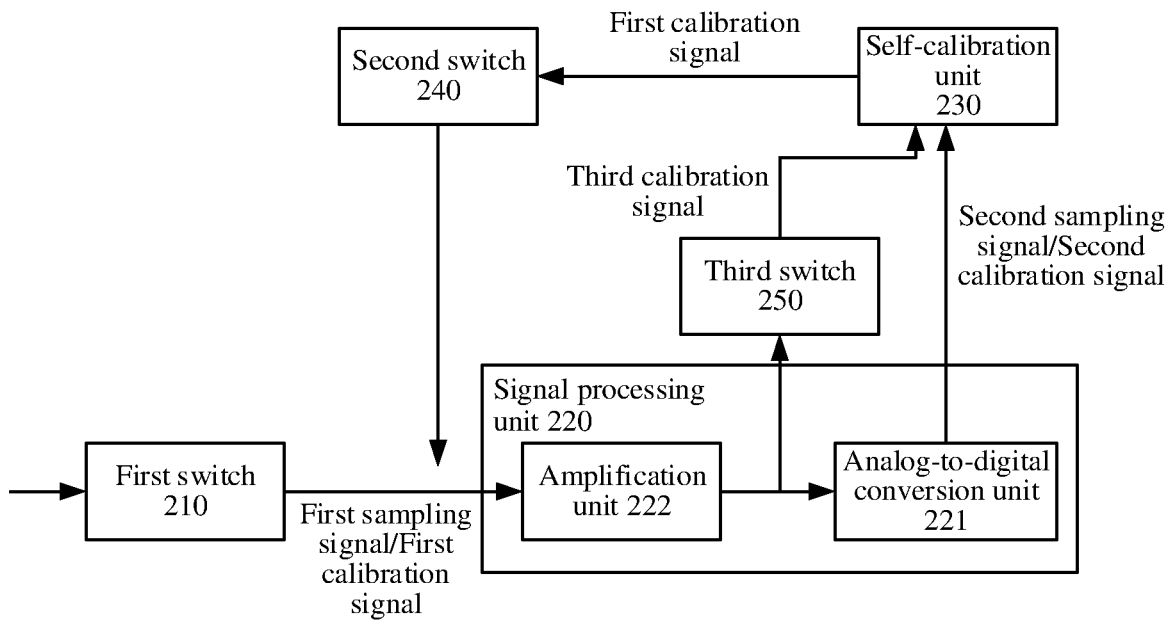
FIG. 4 is another schematic diagram of a structure of a sampling assembly according to this application.

FIG. 4 is another schematic diagram of a structure of a sampling assembly according to this application.

As shown in FIG. 4, when a sampling unit 220 includes an amplification unit 222 and a digital-to-analog conversion unit 221, the sampling assembly may further include a third switch 250. The third switch 250 is connected to an output end of the amplification unit 222 and a self-calibration unit 230. In this case, the self-calibration unit 230 is further configured to: when controlling a second switch 240 to be turned on, control the third switch 250 to be turned on, to enable a third calibration signal output by the amplification unit 222 to be input to the self-calibration unit 230. The self-calibration unit 230 is specifically configured to determine an error signal based on a first calibration signal, a second calibration signal, and the third calibration signal, and compensate for a second sampling signal based on the obtained error signal to obtain a third sampling signal. In other words, error signals may be separately determined for the amplification unit 222 and the analog-to-digital conversion unit 221, to improve a calibration success rate and reduce calibration time.

Figure 5:
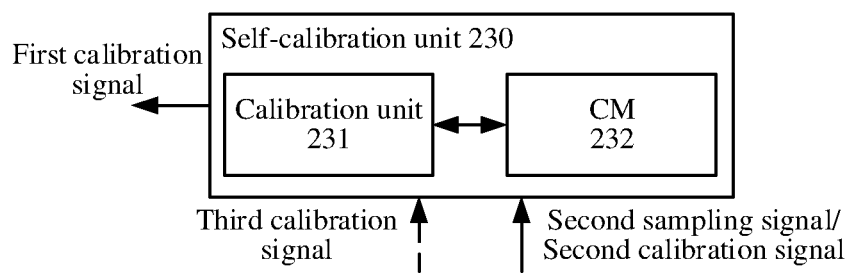
FIG. 5 is a schematic diagram of a structure of a self-calibration unit according to this application.

FIG. 5 is a schematic diagram of a structure of a self-calibration unit 230 according to this application.

As shown in FIG. 5, the self-calibration unit 230 may include a calibration unit 231 and a control unit 232. Function division of the calibration unit 231 and the control unit 232 is not specifically limited in this embodiment of this application.

In some implementations, the calibration unit 231 obtains an error signal based on a first calibration signal, a second calibration signal, and a third calibration signal (optional), and outputs the obtained error signal to the control unit 232. The control unit 232 receives a second sampling signal, and obtains a compensated third sampling signal based on the error signal output by the calibration unit 231 and the second sampling signal.

In some other implementations, the calibration unit 231 obtains an error signal based on a first calibration signal, a second calibration signal, and a third calibration signal (optional), obtains a compensated third sampling signal based on the obtained error signal and the second sampling signal, and outputs the third sampling signal to the control unit 232.

In this application, an input signal of the sampling assembly may be a current signal, or may be a voltage signal. In some implementations, if the input signal of the sampling assembly is the current signal, the sampling assembly further needs to include a sampling resistor 250.

Figure 6:
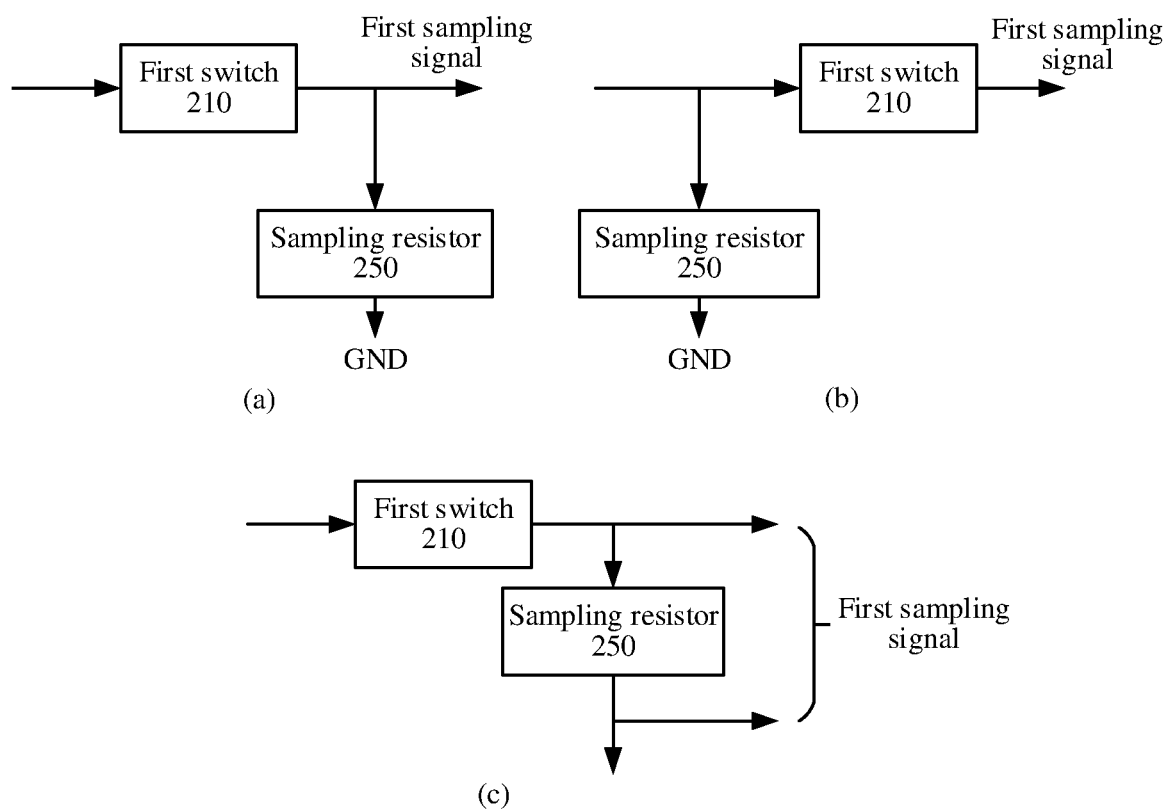
FIG. 6 is a schematic diagram of a possible setting location of a sampling resistor according to this application.

FIG. 6 is a schematic diagram of a possible setting location of a sampling resistor according to this application. As shown in (a) in FIG. 6, one end of a sampling resistor 250 is connected to an output end of a first switch 210, and the other end is grounded (GND). As shown in (b) in FIG. 6, one end of the sampling resistor 250 is connected to an input end of the first switch 210, and the other end is grounded. As shown in (c) in FIG. 6, a first sampling signal may alternatively be in a differential form. In this case, one end of the sampling resistor 250 is connected to the output end of the first switch 210, and the other end is not limited. The first sampling signal is a voltage signal on two ends of the sampling resistor 250. Optionally, if a sampling assembly includes a differential operational amplifier, the two ends of the sampling resistor 250 may be separately input to differential signal input ends of the differential operational amplifier.

It should be noted that the sampling resistor 250 may be a solid resistor, or may be a resistor constructed by using a metal-oxide semiconductor field effect transistor (MOSFET) or a transistor. This is not limited. The sampling resistor 250 may be integrated in a chip, or may be an external solid resistor. This is not limited.

It should be noted that if the sampling assembly in this application is used in sampling of the chip, the sampling assembly may serve as a part of the chip and be disposed inside the chip. Alternatively, a part of the sampling assembly may be disposed inside the chip, and a part may be disposed outside the chip. Alternatively, the entire sampling assembly may be disposed outside the chip. This is not limited.

The foregoing describes in detail the sampling assembly provided in this application. The following describes a sampling method provided in this application.

Figure 7:
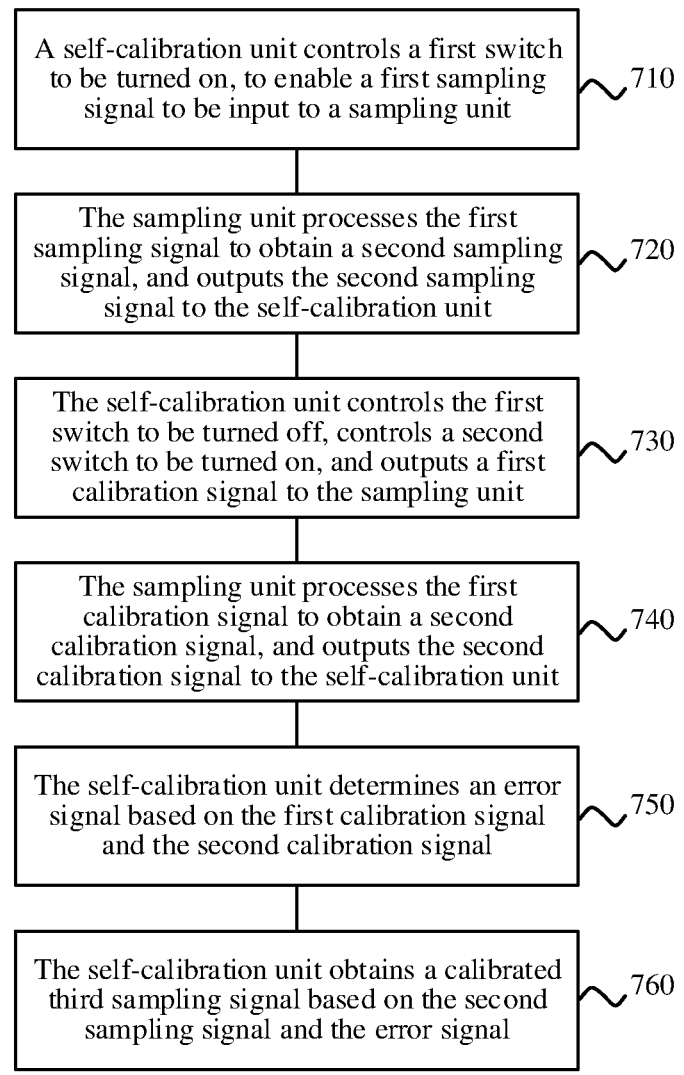
FIG. 7 is a schematic flowchart of a sampling method according to this application.

FIG. 7 is a schematic flowchart of a sampling method according to this application. The method is applied to a sampling assembly including a self-calibration unit, a sampling unit, a first switch, and a second switch. The method includes the following steps.

Step 710: The self-calibration unit controls the first switch to be turned on, to enable a first sampling signal to be input to the sampling unit.

Step 720: The sampling unit processes the first sampling signal to obtain a second sampling signal, and outputs the second sampling signal to the self-calibration unit.

Step 730: The self-calibration unit controls the first switch to be turned off, controls the second switch to be turned on, and outputs a first calibration signal to the sampling unit.

Step 740: The sampling unit processes the first calibration signal to obtain a second calibration signal, and outputs the second calibration signal to the self-calibration unit.

Step 750: The self-calibration unit determines an error signal based on the first calibration signal and the second calibration signal.

Step 760: The self-calibration unit obtains a calibrated third sampling signal based on the second sampling signal and the error signal.

Optionally, the sampling unit includes an amplification unit and/or an analog-to-digital conversion unit.

Optionally, when the sampling unit includes the amplification unit and the analog-to-digital conversion unit, the sampling unit further includes a third switch. The method further includes: When controlling the second switch to be turned on, the self-calibration unit controls the third switch to be turned on, to enable a third calibration signal output by the amplification unit to be input to the self-calibration unit. That the determining an error signal based on the first calibration signal and the second calibration signal includes: determining the error signal based on the first calibration signal, the second calibration signal, and the third calibration signal.

Optionally, the self-calibration unit includes a calibration unit and a control unit. That the self-calibration unit obtains a calibrated third sampling signal based on the second sampling signal and the error signal includes: The calibration unit obtains the error signal. The control unit receives the second sampling signal, and obtains the third sampling signal based on the error signal and the second sampling signal. Alternatively, the calibration unit obtains the third sampling signal, and outputs the third sampling signal to the control unit.

For more detailed descriptions of the sampling method in this application, refer to descriptions of the sampling assembly. Details are not described herein again.

This application further provides a chip. The chip includes the sampling assembly in any one of the foregoing embodiments.

This application further provides an integrated circuit. The integrated circuit includes the sampling assembly in any one of the foregoing embodiments.

This application further provides PSE. The PSE includes the sampling assembly in any one of the foregoing embodiments.

This application further provides a POE system. The system includes the sampling assembly in any one of the foregoing embodiments.

This application further provides a computer-readable storage medium, including instructions. When the instructions are executed by a computer, the method shown in FIG. 7 is implemented.

Terms such as "component", "module", and "system" used in this specification indicate computer-related entities, hardware, firmware, combinations of hardware and software, software, or software being executed. For example, a component may be but is not limited to a process that runs on a processor, a processor, an object, an executable file, an execution thread, a program, or a computer. As illustrated by using figures, both a computing device and an application that runs on the computing device may be components. One or more components may reside within a process or an execution thread, and a component may be located on one computer or distributed between two or more computers. In addition, these components may be executed from various computer-readable media that store various data structures. For example, the components may communicate by using a local or remote process based on a signal having one or more data packets (for example, data from two components interacting with another component in a local system, in a distributed system, or across a network such as the Internet interacting with another system by using the signal).

It should be understood that, an "embodiment" mentioned throughout this specification means that particular features, structures, or characteristics related to this embodiment are included in at least one embodiment of this application. Therefore, embodiments in the entire specification do not necessarily refer to a same embodiment. In addition, these particular features, structures, or characteristics may be combined in one or more embodiments by using any appropriate manner.

It should be understood that, in embodiments of this application, numbers "first", "second", and the like are merely for distinguishing between different objects, for example, to distinguish between different switches, and do not constitute a limitation on the scope of embodiments of this application. Embodiments of this application are not limited thereto.

It should be further understood that, in this application, both "when" and "if" mean that a network element performs corresponding processing in an objective situation, but do not constitute a limitation on time, do not require that the network element has a determining action during implementation, and do not mean other limitations either.

It should be further understood that, in this application, "at least one" means one or more, and "a plurality of" means two or more.

It should be further understood that, in embodiments of this application, "B corresponding to A" indicates that B is associated with A, and B may be determined based on A. However, it should be further understood that determining B based on A does not mean that B is determined based only on A. B may alternatively be determined based on A and/or other information.

It should also be understood that the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between associated objects.

Unless otherwise specified, an expression used in this application similar to an expression that "an item includes one or more of the following: A, B, and C" usually means that the item may be any one of the following: A; B; C; A and B; A and C; B and C; A, B, and C; A and A; A, A, and A; A, A, and B; A, A, and C; A, B, and B; A, C, and C; B and B; B, B and B; B, B and C; C and C; C, C, and C; and another combination of A, B and C. In the foregoing descriptions, three elements A, B, and C are used as an example to describe an optional case of the item. When an expression is "the item includes at least one of the following: A, B, . . . , and X", in other words, more elements are included in the expression, a case to which the item is applicable may also be obtained according to the foregoing rule.

It may be understood that PSE may perform a part or all of the steps in embodiments of this application. The steps or operations are merely examples. Embodiments of this application may further include performing other operations or variations of various operations. In addition, the steps may be performed in a sequence different from a sequence presented in embodiments of this application, and not all the operations in embodiments of this application may be performed.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments of this application may be integrated into one processing unit, each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, or a network device) to perform all or some of the steps of the methods described in embodiments of this application. The foregoing storage medium includes: any medium that can store program code, such as a USB flash drive, a removable hard disk, a read-only memory ROM, a random access memory RAM, a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A sampling assembly, wherein the sampling assembly comprises:
    a self-calibration unit;
    a sampling unit;
    a first switch, wherein the first switch enables a first sampling signal to be input to the sampling unit; and
    a second switch;
    wherein the self-calibration unit is configured to control the first switch to enable the first sampling signal to be input to the sampling unit;
    wherein the sampling unit is configured to:
        process the first sampling signal to obtain a second sampling signal; and
        output the second sampling signal to the self-calibration unit;
    wherein the self-calibration unit is further configured to:
        control the first switch to be turned off;
        control the second switch to be turned on; and
        output a first calibration signal to the sampling unit;
    wherein the sampling unit is further configured to:
        obtain a second calibration signal by processing the first calibration signal; and
        output the second calibration signal to the self-calibration unit;
    wherein the self-calibration unit is further configured to:
        determine an error signal based on the first calibration signal and the second calibration signal; and
    wherein the self-calibration unit is further configured to:
        obtain a calibrated third sampling signal based on the second sampling signal and the error signal.

2. The sampling assembly according to claim 1, wherein the sampling unit comprises an analog-to-digital conversion (ADC) unit.

3. The sampling assembly according to claim 1, wherein the sampling unit comprises an amplification unit.

4. The sampling assembly according to claim 3, wherein the sampling unit comprises an analog-to-digital conversion (ADC) unit.

5. The sampling assembly according to claim 4, wherein the sampling unit further comprises a third switch; and
    wherein the self-calibration unit is further configured to:
        enable, based on controlling the second switch to be turned on, by control the third switch to be turned on, a third calibration signal to be output by the amplification unit, to be input to the self-calibration unit; and
    wherein the self-calibration unit being configured to determine the error signal based on the first calibration signal and the second calibration signal further comprises that the self-calibration unit is configured to determine the error signal based on the first calibration signal, the second calibration signal, and the third calibration signal.

6. The sampling assembly according to claim 1, wherein the self-calibration unit comprises a calibration unit and a control unit;
    wherein the calibration unit is configured to obtain the error signal; and
    wherein the control unit is configured to:
        receive the second sampling signal; and
        obtain the third sampling signal based on the error signal and the second sampling signal.

7. The sampling assembly according to claim 1, wherein the self-calibration unit comprises a calibration unit and a control unit; and
   wherein the calibration unit is configured to obtain the third sampling signal and output the third sampling signal to the control unit.

8. A sampling method, wherein the method comprises:
   controlling, by a self-calibration unit in a sampling assembly, a first switch in the sampling assembly to be turned on, wherein the first switch being turned on enables a first sampling signal to be input to a sampling unit;
   obtaining, by a sampling unit in the sampling assembly, a second sampling signal by processing the first sampling signal, and outputting the second sampling signal to the self-calibration unit;
   controlling, by the self-calibration unit, the first switch to be turned off;
      controlling, by the self-calibration unit, based on the first switch being turned off, the second switch to be turned on;
      outputting, by the self-calibration unit, based on the second switch being turned on, a first calibration signal to the sampling unit;
   obtaining, by the sampling unit, a second calibration signal by processing the first calibration signal; and
   outputting, by the sampling unit, the second calibration signal to the self-calibration unit;
      determining, by the self-calibration unit, an error signal based on the first calibration signal and the second calibration signal; and
      obtaining, by the self-calibration unit, a calibrated third sampling signal based on the second sampling signal and the error signal.

9. The method according to claim 8, wherein the sampling unit comprises an analog-to-digital conversion (ADC) unit.

10. The method according to claim 8, wherein the sampling unit comprises an amplification unit.

11. The method according to claim 10, wherein the sampling unit comprises an analog-to-digital conversion (ADC) unit.

12. The method according to claim 11, wherein the sampling unit further comprises a third switch; and wherein the method further comprises:
   controlling, by the self-calibration unit, based on controlling the second switch to be turned on, the third switch to be turned on, wherein the third switch being turned on enables a third calibration signal output by the amplification unit to be input to the self-calibration unit; and
   wherein the determining an error signal based on the first calibration signal and the second calibration signal comprises:
      determining the error signal based on the first calibration signal, the second calibration signal, and the third calibration signal.

13. The method according to claim 8, wherein the self-calibration unit comprises a calibration unit and a control unit; and
   wherein the obtaining, by the self-calibration unit, the calibrated third sampling signal based on the second sampling signal and the error signal comprises:
      obtaining, by the calibration unit, the error signal; and
      receiving, by the control unit, the second sampling signal, and
      obtaining the third sampling signal based on the error signal and the second sampling signal.

14. The method according to claim 8, wherein the self-calibration unit comprises a calibration unit and a control unit; and
   wherein the obtaining, by the self-calibration unit, the calibrated third sampling signal based on the second sampling signal and the error signal comprises:
      obtaining, by the calibration unit, the third sampling signal; and
      outputting the third sampling signal to the control unit.

15. A non-transitory computer-readable storage medium storing a program to be executed by a processor, the program including instructions for:
   controlling, by a self-calibration unit in a sampling assembly, a first switch in the sampling assembly to be turned on, wherein the first switch being turned on enables a first sampling signal to be input to a sampling unit;
   obtaining, by a sampling unit in the sampling assembly, a second sampling signal by processing the first sampling signal, and outputting the second sampling signal to the self-calibration unit;
   controlling, by the self-calibration unit, the first switch to be turned off;
      controlling, by the self-calibration unit, based on the first switch being turned off, the second switch to be turned on;
      outputting, by the self-calibration unit, based on the second switch being turned on, a first calibration signal to the sampling unit;
   obtaining, by the sampling unit, a second calibration signal by processing the first calibration signal; and
   outputting, by the sampling unit, the second calibration signal to the self-calibration unit;
      determining, by the self-calibration unit, an error signal based on the first calibration signal and the second calibration signal; and
      obtaining, by the self-calibration unit, a calibrated third sampling signal based on the second sampling signal and the error signal.

16. The non-transitory computer-readable storage medium according to claim 15, wherein the sampling unit comprises an analog-to-digital conversion (ADC) unit.

17. The non-transitory computer-readable storage medium according to claim 15, wherein the sampling unit comprises an amplification unit.

18. The non-transitory computer-readable storage medium according to claim 17, wherein the sampling unit comprises an analog-to-digital conversion (ADC) unit.

19. The non-transitory computer-readable storage medium according to claim 18, wherein the sampling unit further comprises a third switch; and wherein the method further comprises:
   controlling, by the self-calibration unit, based on controlling the second switch to be turned on, the third switch to be turned on, wherein the third switch being turned on enables a third calibration signal output by the amplification unit to be input to the self-calibration unit; and
   wherein the determining an error signal based on the first calibration signal and the second calibration signal comprises:
      determining the error signal based on the first calibration signal, the second calibration signal, and the third calibration signal.

20. The non-transitory computer-readable storage medium according to claim 15, wherein the self-calibration unit comprises a calibration unit and a control unit; and wherein the obtaining, by the self-calibration unit, the calibrated third sampling signal based on the second sampling signal and the error signal comprises:
obtaining, by the calibration unit, the error signal; and
receiving, by the control unit, the second sampling signal, and
obtaining the third sampling signal based on the error signal and the second sampling signal.

\* \* \* \* \*